(12) United States Patent
Iida

(10) Patent No.: US 6,268,740 B1
(45) Date of Patent: Jul. 31, 2001

(54) SYSTEM FOR TESTING SEMICONDUCTOR DEVICE FORMED ON SEMICONDUCTOR WAFER

(75) Inventor: Itaru Iida, Higashiyatsushiro-gun (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/462,039

(22) PCT Filed: May 19, 1999

(86) PCT No.: PCT/JP99/02616

§ 371 Date: Dec. 29, 1999

§ 102(e) Date: Dec. 29, 1999

(87) PCT Pub. No.: WO99/60624

PCT Pub. Date: Nov. 25, 1999

(30) Foreign Application Priority Data

May 20, 1998 (JP) ............................................... 10-156690

(51) Int. Cl.[7] .................................................. G01R 31/26
(52) U.S. Cl. ........................ 324/765; 324/764; 324/755
(58) Field of Search .................................. 324/754, 758, 324/755, 759, 764, 765, 158.1

(56) References Cited

U.S. PATENT DOCUMENTS

| | | | |
|---|---|---|---|
| 5,742,173 | * | 4/1998 | Nakagomi et al. .................. 324/758 |
| 5,805,472 | * | 9/1998 | Fukasawa .......................... 324/755 X |
| 6,097,204 | * | 8/2000 | Tanka et al. ........................ 324/765 |

FOREIGN PATENT DOCUMENTS

| | | |
|---|---|---|
| 7-231019 | 8/1995 | (JP) . |
| 8-005666 | 1/1996 | (JP) . |
| 8-340030 | 12/1996 | (JP) . |
| 9-138256 | 5/1997 | (JP) . |
| 11-145225 | 5/1999 | (JP) . |
| 11-238767 | 8/1999 | (JP) . |

OTHER PUBLICATIONS

U.S. Ser. No. 09/288,291, filed Apr. 8, 1999.
Internal Application No. PCT/JP99/02615, filed May 19, 1999.

* cited by examiner

Primary Examiner—Ernest Karlsen
Assistant Examiner—Minh N. Tang
(74) Attorney, Agent, or Firm—Morrison & Foerster L

(57) ABSTRACT

A test system of the present invention is suitable especially for a reliability test. A reader (23) for reading a wafer identification code attached to a wafer (W) and a reader (24) for reading a shell identification code (14) attached to a test shell (1), are provided for an aligner (2). A reader (36) for reading the shell identification code (14) is provided for a rest apparatus. A transmission system (41) is provided, through which information read by the readers (24, 36) are exchanged between the aligner (2) and the test apparatus (3). A storage devices (25b, 34b, 35b) are used for storing the information. Owing to the use of these structural elements, the IC chips formed on a semiconductor wafer can be accurately tested with high efficiency. The test shell used in the test can be disassembled accurately and reliably.

21 Claims, 8 Drawing Sheets

SYSTEM FOR TESTING SEMICONDUCTOR DEVICE FORMED ON SEMICONDUCTOR WAFER

TECHNICAL FIELD

The present invention relates to a test system for testing semiconductor elements (hereinafter referred to as "IC chips") formed on a semiconductor wafer (hereinafter referred to as "wafer"). More specifically, the invention relates to a test system which brings a wafer and a contactor into contact with each other to form a one-body structure (hereinafter referred to as a "test shell"), then tests electrical characteristics of the IC chips by use of that test shell, and smoothly disassembles the test shell back into the wafer and the contactor at the end of the test. It should be noted in particular that the present invention is suitably applicable to a reliability test system.

The contactor is an electric contact means that is provided with: contact terminals which are simultaneously brought into electrical contact with the electrodes of a plurality of IC chips on a wafer; and external terminals that are connected to the contact terminals. The contactor, the wafer and a wafer holder (hereinafter referred to as a "wafer chuck") are assembled as a one-body structure by vacuum suction, and a technique for forming a test shell thereby is referred to as an aligner.

BACKGROUND ART

In a semiconductor inspection process, the electrical characteristics of a large number of IC chips formed on the surface of a wafer are examined. On the basis of the results of this examination, the IC chips are screened to select those ones that have no electrical defects. The non-defective chips selected by the screening are subjected to an assembling process, in which they are packaged in synthetic resin or a ceramic material. In a reliability test, the packaged products are examined, with thermal stress and electrical stress being applied thereto. In this test, potential defects or the like of the IC chips are detected, and IC chips having such defects are removed.

In accordance with the demand for small-sized and sophisticated electrical products, IC chips that are developed are also miniaturized and highly integrated. In recent years, a variety of mount techniques have been developed, so as to provide further compact semiconductor products. For example, there is technology that enables the mounting of a so-called bare IC chip (i.e., an IC chip that is not packaged). In order to commercialize bare IC chips, their quality must be guaranteed beforehand. In other words, the reliability of the bare IC chips must be tested so as to place quality-guaranteed IC chips on the market. If the conventional reliability test apparatus is employed for the inspection of bare IC chips, various problems have to be solved. For one thing, a reliable electrical connection has to be made between bare IC chips and sockets. In addition, it is very troublesome to handle small-sized IC chip, resulting in an increase in the inspection cost.

Under the circumstances, technology for executing a reliability test for testing a large number of IC chips formed on a plurality of wafers, is proposed. Such technology is proposed, for example, in Jpn. Pat. Appln. KOKAI Publications No. 7-231019, No. 8-5666 and No. 8-340030.

In the conventional art, however, a contactor and wafers are arranged to face each other when the wafers are simultaneously brought into contact with the contactor. Some of the contact terminals, which are used as reference points of the contactor, are visually positioned with respect to the corresponding electrode pads, which are used as reference points of the wafers (the position operation will be hereinafter referred to as "alignment"). Since it takes a long time for the operator to finish the alignment, the alignment has problems in that the operation efficiency is low, a heavy load is imposed on the operator, and the alignment accuracy is dependent on the operator's ability for visual alignment, resulting in failure to provide a stable contact state at all times.

In order to realize a reliability test system, the present applicant proposed an aligner for a shell assembling mechanism in Japanese Patent Application No. 10-54423. The shell assembling mechanism comprises: a wafer holder member (hereinafter referred to as "wafer chuck") that is positioned and held on a mount table (hereinafter referred to as a "main chuck") by means of positioning pins; a wafer placed on the wafer chuck by a conveyance mechanism (hereinafter referred to as "tweezers"); and a contactor removably attached to the head plate of the main apparatus. These three structural components are assembled as a one-body structure by vacuum suction. The aligner aligns a wafer with the contactor by moving the main chuck in X, Y, Z and θ directions, and raises the main chuck to simultaneously bring the above three structural components into contact with one another. The vacuum coupling of the main chuck is connected to the valve mechanism of the wafer chuck, and the wafer and the contactor are sucked to the wafer chuck by utilization of the vacuum suction of the wafer chuck. In Japanese Patent Application No. 9-318920, the present applicant also proposed a wafer temperature control apparatus and a wafer storage chamber (hereinafter referred to as a "test chamber") that allow a wafer, assembled as a shell, to be kept at a constant test temperature during a reliability test. It should be noted that after the reliability test is conducted in the test chamber, the shell is disassembled into three components, namely, a wafer chuck, a wafer and a contactor in the aligner. At the time of this disassembling operation, the main chuck on which the shell is mounted must be positioned to the same location as that where it was when the shell was formed (the location must be the same in light of the X, Y and θ directions). If the main chuck is raised to a different location to mount the shell on the main chuck, the positioning pin holes of the wafer chuck of the shell loaded on the head plate do not align with the positioning pins of the main chuck. As a result, the shell cannot be placed on the main chuck in a positioned state. Since, in this case, the vacuum coupling of the main chuck and the valve mechanism of the wafer chuck are not connected, the shell is not released from the vacuum state. Accordingly, the shell cannot be disassembled into the three components described above.

DISCLOSURE OF INVENTION

The present invention has been contrived to solve the above problems. Accordingly, the object of the present invention is to provide a test system which, at the end of a test, automatically moves a main chuck (mount table) to a position where a wafer chuck, a wafer and a contactor are assembled as one body to form a shell, then places the shell on the main chuck in a positioned state, and then disassembles the shell into the three components.

According to the first aspect of the present invention, there is provided a test system for testing semiconductor elements formed on a semiconductor wafer, the test system comprising:

an aligner for bringing three components into contact with one another to form a one-body structure, the three components being a wafer holder member used for holding a semiconductor wafer, a semiconductor wafer having a plurality of semiconductor elements on a surface, and a contactor having a plurality of contact terminals to be brought into electric contact with electrodes of the semiconductor elements, and for using the one-body structure as a test shell, the aligner including:

a shell assembling mechanism for forming the test shell by vacuum suction;

a first read device for reading the shell identification code attached to the test shell;

a first storage device for storing the read shell identification code; and a first control device for controlling the shell assembling mechanism to form the test shell;

a test apparatus for executing a test with respect to the semiconductor elements of the test shell, the test apparatus including:

a second read device for reading the shell identification code attached to the test shell; and a second storage device for storing results of the test in association with the shell identification code; and a transmission system for enabling information stored in the first and second storage devices to be exchanged between the aligner and the test apparatus.

According to the second aspect of the present invention, there is provided a test system for testing semiconductor elements formed on a semiconductor wafer, the test system comprising:

an aligner for bringing three components into contact with one another to form a one-body structure, the three components being a wafer holder member used for holding a semiconductor wafer, a semiconductor wafer having a plurality of semiconductor elements on a surface, and a contactor having a plurality of contact terminals to be brought into electric contact with electrodes of the semiconductor elements, and for using the one-body structure as a test shell, the aligner including:

a shell assembling/dissembling mechanism for forming the test shell by vacuum suction and for disassembling the test shell by removing the vacuum suction;

a first read device for reading the shell identification code attached to the test shell;

a first storage device for storing conditions under which the test shell is formed by the shell assembling/disassembling mechanism and the shell identification code read by the read device; and a first control device for controlling the shell assembling/disassembling mechanism to assemble or disassemble the test shell;

a test apparatus for executing a test with respect to the semiconductor elements of the test shell, the test apparatus including:

a second read device for reading the shell identification code attached to the test shell; and a second storage device for storing results of the test in association with the shell identification code; and a transmission system for enabling information stored in the first and second storage devices to be exchanged between the aligner and the test apparatus.

According to the third aspect of the present invention, there is provided a test system for testing semiconductor elements formed on a semiconductor wafer, the test system comprising:

an aligner for bringing three components into contact with one another to form a one-body structure, the three components being a wafer holder member used for holding a semiconductor wafer, a semiconductor wafer having a plurality of semiconductor elements on a surface, and a contactor having a plurality of contact terminals to be brought into electric contact with electrodes of the semiconductor elements, and for using the one-body structure as a test shell, the aligner including:

an attaching mechanism for attaching the contactor to a predetermined position on a main body of the aligner;

a mount table on which the wafer holder member holding the semiconductor wafer is placed;

a mount table-driving mechanism for moving the mount table in X, Y and θ directions to position the electrodes of the semiconductor elements with reference to the contact terminals of the contactor;

a first read device for reading the shell identification code attached to the test shell;

a first storage device for storing position coordinates representing a position to which the mount table is moved in the X, Y and θ directions for positioning;

a shell assembling/disassembling mechanism for forming the test shell by vacuum suction and for disassembling the test shell by removing the vacuum suction;

a first control device for setting the test shell at a disassembling position based on the position coordinates representing a position at which the mount table is located when the test shell is formed, and for performing control to disassemble the test shell;

a test apparatus for executing a test with respect to the semiconductor elements of the test shell, the test apparatus including:

a second read device for reading the shell identification code attached to the test shell; and a second storage device for storing results of the test in association with the shell identification code; and a transmission system for enabling information stored in the first and second storage devices to be exchanged between the aligner and the test apparatus.

According to the fourth aspect of the present invention, there is provided a method for testing electrical characteristics of semiconductor elements formed on a semiconductor wafer, the method comprising the steps of:

(a) bringing three components into contact with one another in an aligner to form a one-body structure, the three components being a wafer holder member used for holding a semiconductor wafer, a semiconductor wafer having a plurality of semiconductor elements on a surface thereof, and a contactor having a plurality of contact terminals to be brought into electric contact with electrodes of the semiconductor elements, and using the one-body structure to form a test shell;

(b) reading a shell identification code attached to the test shell and storing the shell identification code in a first storage device;

(c) causing a test apparatus to execute a test for testing the electrical characteristics of the semiconductor elements formed on the semiconductor wafer included in the test shell; and (d) exchanging the shell identification code attached to the test shell and results of the test between the aligner and the test apparatus.

According to the fifth aspect of the present invention, there is provided a method for testing electrical characteristics of semiconductor elements formed on a semiconductor wafer, the method comprising the steps of:

(a) bringing three components into contact with one another in an aligner to form a one-body structure, the three components being a wafer holder member used for holding a semiconductor wafer, a semiconductor wafer having a plurality of semiconductor elements on a surface thereof, and a contactor having a plurality of contact terminals to be brought into electric contact with electrodes of the semiconductor elements, and using the one-body structure as a test shell;

(b) reading a shell identification code attached to the test shell;

(c) storing conditions under which the test shell is formed, along with the shell identification code;

(d) causing a test apparatus to execute a test for testing the electrical characteristics of the semiconductor elements formed on the semiconductor wafer included in the test shell;

(e) exchanging information to be exchanged between the aligner and the test apparatus, the information to be exchanged including information regarding the shell identification code attached to the test shell, the conditions under which the test shell is formed, and results of the test; and (f) causing the aligner to disassemble the test shell on the basis of information transmitted from the test apparatus.

It is desirable that the test system according to the first, second or third aspect further comprise a third read device for reading the wafer identification code attached to the semiconductor wafer, and that the second storage device store the wafer identification code as well.

Likewise, it is desirable that the transmission system of the test system be an electrical communication device.

Likewise, it is desirable that the transmission system of the test system be a memory provided for the test shell.

Likewise, it is desirable that the test apparatus of the test system be a reliability test apparatus.

Likewise, it is desirable in the test system that the shell identification code be attached to at least one of the contactor and the wafer holder member.

Likewise, it is desirable in the test system that the conditions which are stored in the first storage device and under which the test shell is formed, include position coordinates representing where the wafer holder member and the contactor are located when the test shell is formed.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

BEST MODE FOR CARRYING OUT THE INVENTION

The present invention will now be described on the basis of the embodiments shown in FIGS. 1A to 10. The present invention relates to a test system which simultaneously tests IC chips on a wafer at one time, and the test executed thereby is not limited to a reliability test. In the description given below, however, the present invention will be described, referring to a reliability test system, since reference to this type of test system is considered helpful in specifically describing the invention.

Figure 1A:
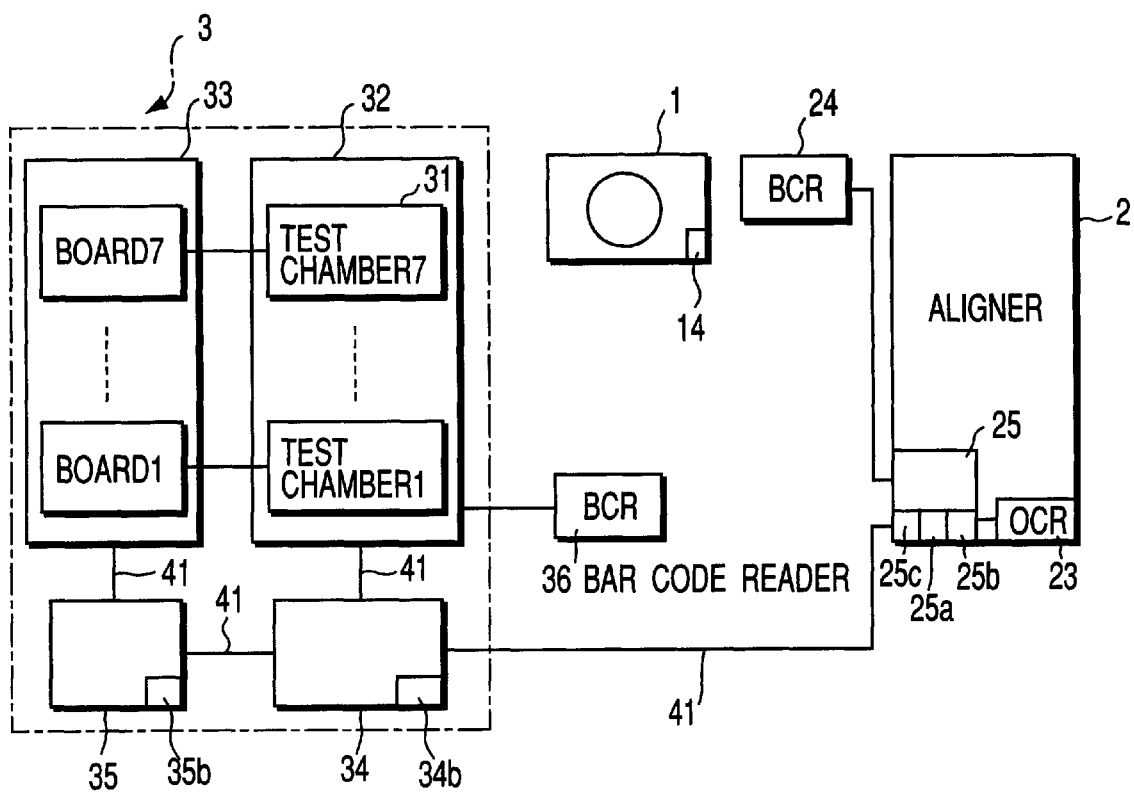
FIGS. 1A and 1B are structural illustrations showing a test system according to one embodiment of the present invention.

As shown in FIG. 1A, the reliability test system according to one embodiment comprises: an aligner 2 for assembling a wafer chuck, a wafer and a contactor as a one-body structure serving as a shell 1; a reliability test apparatus 3 for testing the reliability of the wafer included in the shell 1; and a transmission system 41 for enabling various kinds of data to be exchanged between the reliability test apparatus 3 and the aligner 2. In the case of this embodiment, the transmission means system 41 is specifically a communication means. The reliability test system manages the results of a wafer test and a contactor & wafer test on the basis of a wafer identification code (e.g., character information) and a shell identification code (e.g., a bar code). Where the transmission system 41 is an electrical communication device, it is realized by use of such an interface as RS232C, and a LAN as exemplified by an Ethernet.

As shown, for example, in FIG. 2, the aligner 2 comprises: a loader chamber 21 for storing wafers W in units of one cassette and loading/unloading the wafers W; an alignment chamber 22 adjacent to the loader chamber 21, with a partitioning wall interposed; a read device for reading the wafer identification code 13 attached to a wafer W (the read device is, for example, an optical character reader OCR and will be hereinafter referred to as a "third read device"); and a read device for reading the shell identification code attached to a shell 1 (the read device is, for example, a bar code reader and will be hereinafter referred to as a "first read device"). The alignment chamber 22 is provided with a mechanism which first positions a wafer W with reference to a contactor 12 held on a head plate 22A by moving a wafer chuck 11 on which that wafer W is held, and subsequently brings the wafer W and the contactor 12 into contact with each other by vacuum suction, thereby forming a test shell 1 that is an integrated combination of the wafer chuck 11, the wafer W and the contactor 12. The shell identification code 14 can be attached to at least one of the wafer chuck 11 and the contactor 12 that form the shell 1.

These apparatuses are driven under the control by a control device 25. Although not shown, a transfer mechanism (hereinafter referred to as "tweezers") and a preliminary alignment mechanism (hereinafter referred to as a "sub chuck") are provided in the loader chamber 21. By means of the tweezers, wafers W are taken out from a cassette one by one for transportation. In this transport process, the wafer identification code 13 attached to each wafer W is read by the third read device 23. After the wafer ID and/or the lot ID of the wafer w are confirmed, the wafer W is preliminarily positioned on the sub chuck, with an orientation flat used as a reference. (This positioning will be hereinafter referred to as "pre-alignment.") Subsequently, the wafer W transported to the alignment chamber 22. Before the contactor and the wafer chuck are assembled as a shell 1, the shell identification code 14 attached to one of them can be read by the first read device 24.

Figure 2:
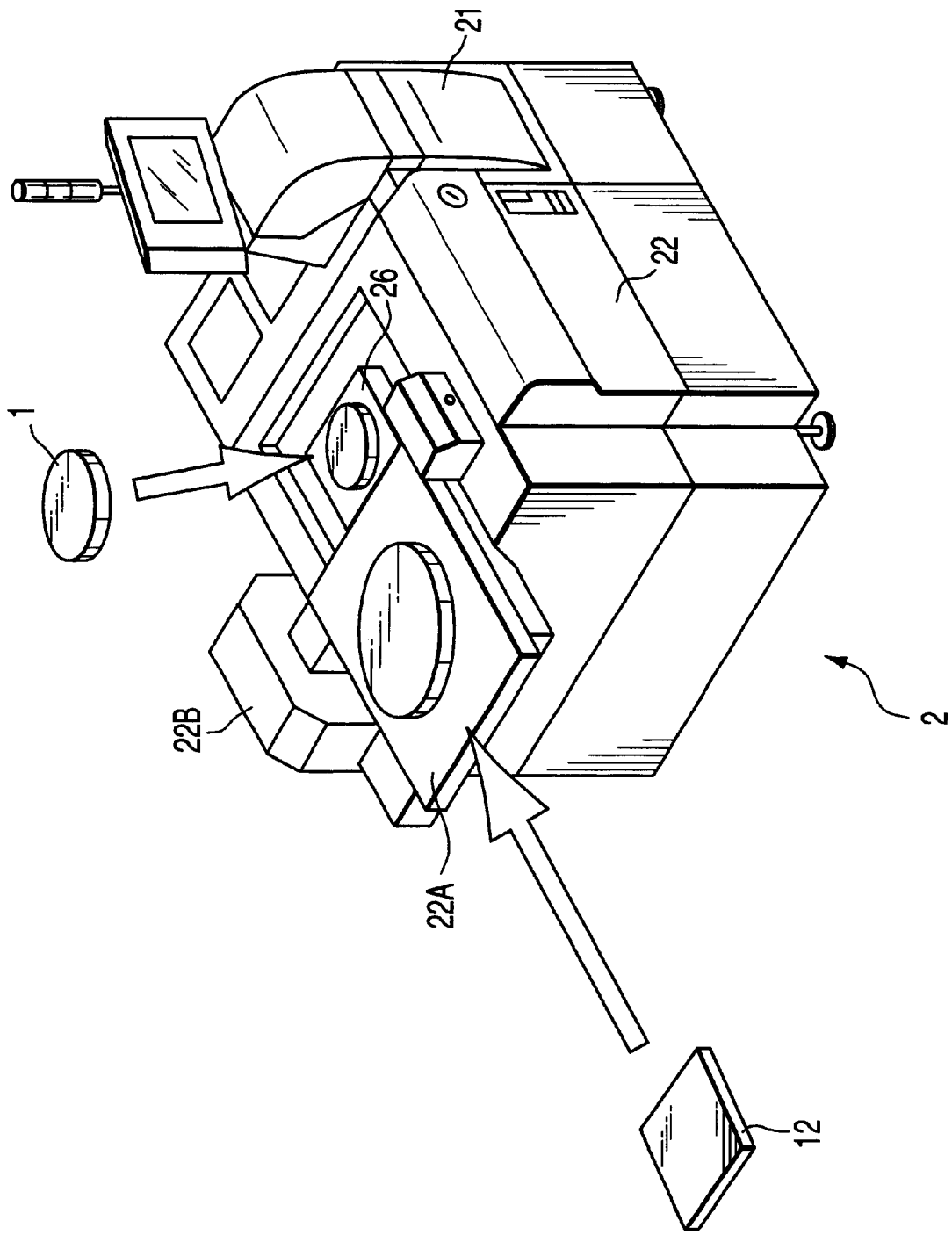
FIG. 2 is a perspective view showing an aligner employed in the test system shown in FIG. 1A.
Figure 3:
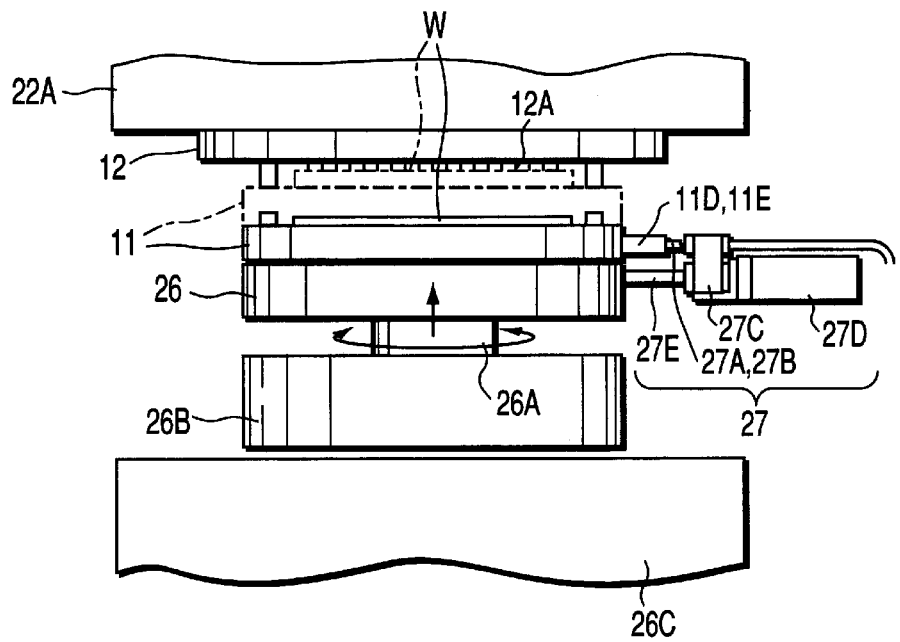
FIG. 3 is a side view showing how a wafer chuck, a wafer and a contactor are brought into contact with one another in the shell assembling mechanism or shell assembling/disassembling mechanism employed in the aligner depicted in FIG. 2.

As shown in FIG. 2, the alignment chamber 22 is provided with a head plate 22A, by which the alignment chamber 22 is opened and closed. The contactor 12 is mounted on the head plate 22A. The open section of the alignment chamber 22 is opened or closed, with the head plate moved by an opening/closing mechanism 22B. A main chuck 26, which is movable in the X, Y, Z and θ directions, is arranged inside the alignment chamber 22 in such a manner that the main chuck 26 is located under the head plate 22A. A wafer chuck 11 is mounted on the main chuck 26. As shown in FIG. 3, the main chuck 26 is located above an X stage 26B, and is vertically movable in the Z direction and reversibly rotatable in the θ direction by means of a rotating/lifting mechanism 26A. The x stage 26B is supported on a Y stage 26C to be movable in the X direction, and the Y stage 26C is supported on a base (not shown) to be movable in the Y direction. The rotating/lifting mechanism 26A, the X stage 26B and the Y stage 26C jointly constitute a movable part of the main chuck. After being pre-aligned by the tweezers of the loader chamber 21, the wafer W is placed on the wafer chuck 11, which is placed on the main chuck 26 of the alignment chamber 22.

Although not shown, an alignment mechanism is arranged inside the alignment chamber 22. This alignment mechanism is provided with an upper camera secured to an alignment bridge, and a lower camera secured to the main chuck 26. When the main chuck 26 is moving, an image of the inspection pads of a wafer W placed on the main chuck 26 is recorded, thereby measuring the position of the inspect pads. On the other hand, an image of the contact terminals (e.g., bump terminals) 12A of the contactor 12 secured to the head plate 22A is recorded, thereby measuring the position of the contact terminals. On the basis of the image data thus obtained, the wafer W and the contactor 12 are aligned with each other. An alignment mechanism used for this purpose can be realized by using the technology proposed in Japanese Patent Application No. 10-54423, for example.

Figure 4:
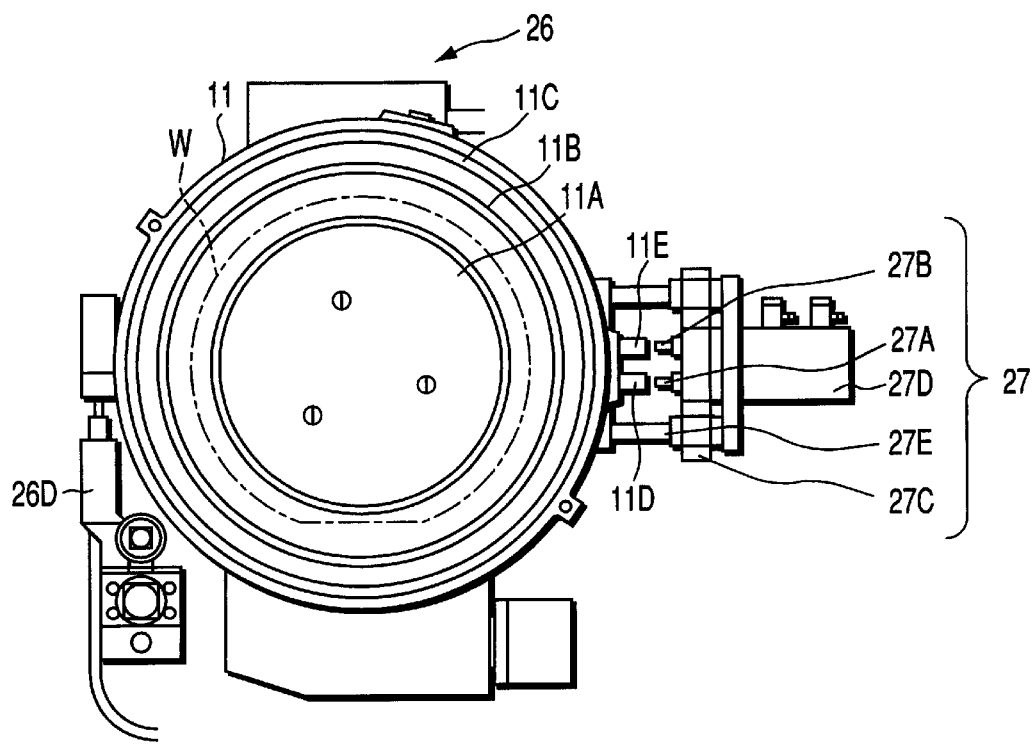
FIG. 4 is a plan view of a wafer chuck of a wafer chuck to be assembled in a shell in the shell assembling mechanism or shell assembling/disassembling mechanism employed in the aligner depicted in FIG. 2.

After the wafer W is aligned inside the alignment chamber 22, the main chuck 26 is raised in the Z direction by the rotating/lifting mechanism 26A. In FIGS. 3 and 4, an embodied form of a shell assembling mechanism or shell assembling/disassembling mechanism is shown. As shown in FIG. 3, the inspection electrode pads of a wafer W are simultaneously brought into contact with the bump terminals 12A of the contactor 12. As will be described later, the contactor 12 is attracted to the upper surface of the wafer chuck 11 by vacuum suction, so that the wafer chuck 11, the wafer W and the contactor 12 form a one-body structure serving as a test shell by the vacuum suction.

The first control device 25 comprises a central processing unit 25a, a first storage device 25b and an input/output device 25c. The central processing unit prepares a database wherein the values (OCR values) obtained by reading the wafer identification codes 13 (e.g., character information) of wafers W are associated with the shell identification codes (e.g., BCR values). This database is stored in the first storage device 25b.

The first storage device 25b stores position coordinate data (X, Y, θ and/or Z) representing where the main chuck 26 is located when the wafer chuck 11, wafer W and contactor 12 are assembled in one body to form the test shell 1. The position coordinate data are stored as test shell-forming conditions. As will be describe later, the position coordinate data are used when the shell 1 is disassembled back into the three components described above.

As shown in FIG. 4, the wafer chuck 11 has concentric annular grooves 11A and 11B formed in the upper surface thereof. The annular grooves 11A and 11B communicate with an internal passage at a number of positions. A seal ring 11C is attached to the upper surface of the wafer chuck 11 in such a manner that the seal ring 11C is close to the outer circumference of the wafer chuck 11. The seal ring 11C is formed of a soft elastic material, such as silicone rubber. The seal ring 11C serves to prevent "vacuum escape" of the test shell. First and second vacuum mechanisms 11D and 11E are arranged at the circumferential surface of the main chuck 26. Through the valve mechanisms 11D and 11E, air is supplied into the internal passage or drawn out therefrom.

As shown in FIGS. 3 and 4, a valve operation mechanism 27 is attached to the circumferential surface of the main chuck 26. By this valve operation mechanism 27, the first and second valve mechanisms 11D and 11E are opened or closed. As shown in FIGS. 3 and 4, the valve operation mechanism 27 comprises: first and second quick couplings 27A and 27B which are to be connected to the first and second valve mechanisms 11D and 11E, respectively; a main body 27C having an internal passage to which the quick couplings 27A and 27B are connected; an air cylinder 27D having piston rods secured to the end of the main body 27C; and a pair of guide rods 27E for guiding the movement of the main body 27C. By the air cylinder 27D, the first and second quick couplings 27A and 27B are advanced and moved into the first and second valve mechanisms 11D and 11E, whereby the valve bodies of the first and second valve mechanisms 11D and 11E are moved to the closed position. When the first and second quick couplings 27A and 27B are retracted, they separate from the first and second valve mechanisms 11D and 11E, whereby the valve bodies of the first and second valve mechanisms 11D and 11E are moved to the open position. With this structure, wafer w and the contactor 12 are placed on the wafer chuck 11 in the order mentioned, and first and second quick couplings 27A and 27B of the valve operation mechanism 27 are connected to the first and second valve mechanisms 11D and 11E of the wafer chuck 11, respectively. The internal passage of the wafer chuck 11 is connected to a vacuum evacuating apparatus, as a result of which the wafer chuck 11, the wafer W and the contactor 12 are assembled as one body. In FIG. 4, reference symbol 26D denotes a θ driving mechanism used for alignment. By this θ driving mechanism 26D, the main chuck 26 is rotated in the θ direction in a reversible manner.

Figure 5:
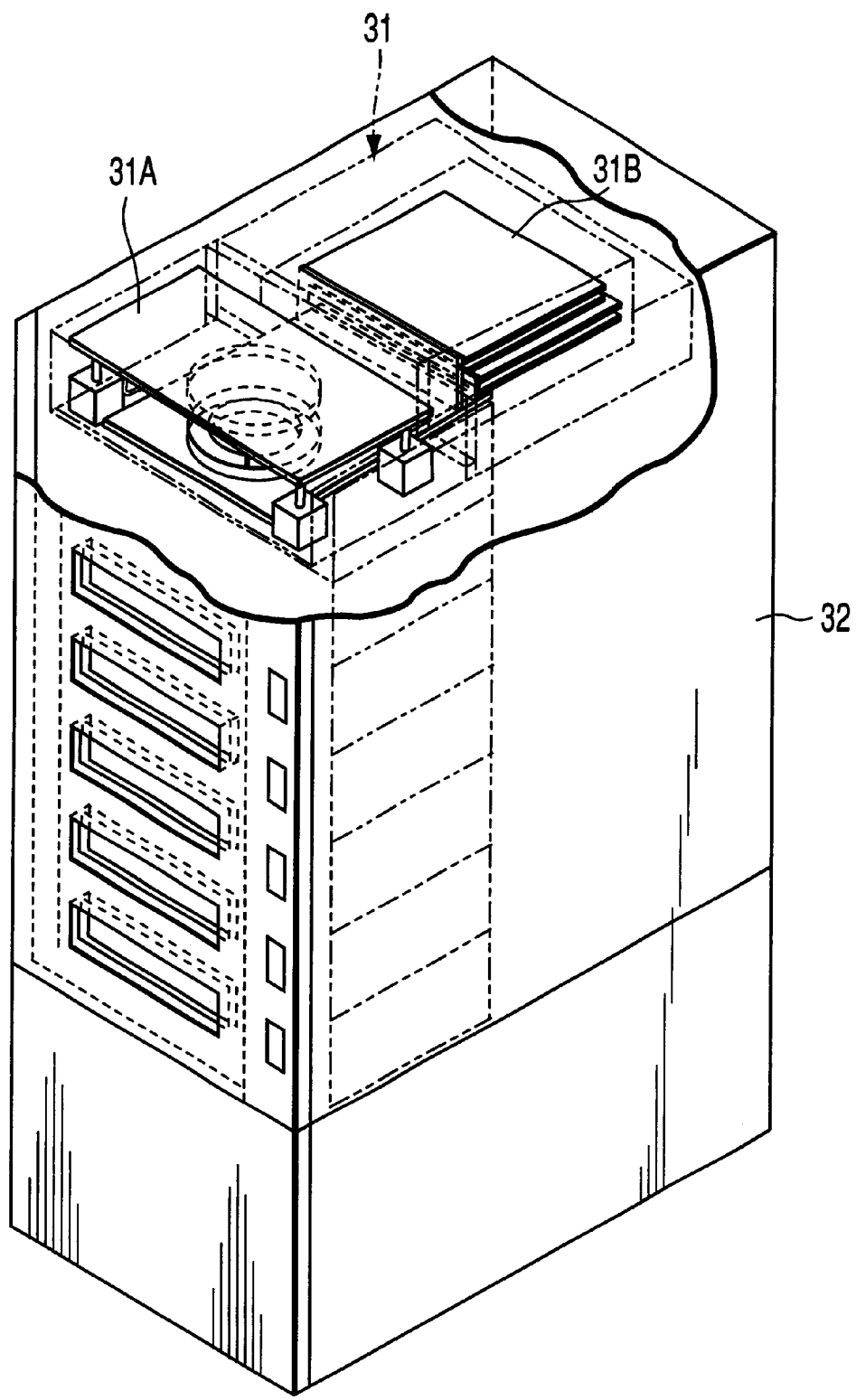
FIG. 5 is a partially-cutaway perspective view of a test chamber provided in the test system shown in FIG. 1A.

As shown in FIGS. 1A and 5, the reliability test apparatus 3 comprises: test chambers 31; a housing 32 in which the test chambers 31 are vertically arranged at a number of levels (e.g., at seven levels); a tester 33 for transmitting test signals to the wafers W in the test chambers 31 and receiving responses therefrom; and second and third control devices 34 and 35 for controlling the test chambers 31 and tester 33. Under the control of the second control device 34, a test shell 1 formed in the aligner 2 is inserted into each of the test chambers 31, and test conditions such as a test temperature are controlled. Under the control of the third control device 35, the tester 33 transmits test signals to each of the test chambers 31 and receives responses therefrom. In addition, the tester 33 analyzes the test results. As shown in FIG. 1A, the reliability test apparatus 3 is provided with a second read device 36 for reading a shell identification code 14 (e.g., bar codes) attached to a test shell. The shell identification code is described on the outer surface of at least one of the wafer chuck 11 and the contactor 12. Each test shell is identified on the basis of the shell identification code.

Figure 1B:
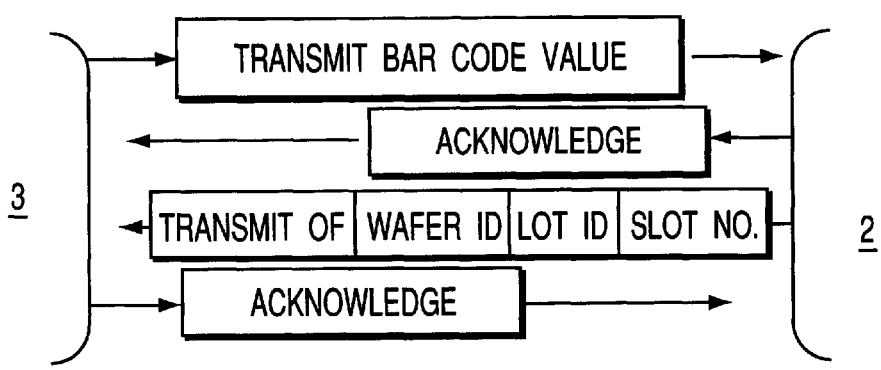

As described above, the first control device 25 of the aligner 2 and the second and third control devices 34 and 35 of the reliability test apparatus 3 are connected together by means of a transmission system 41 (e.g., an electrical communication device [cable]), and various kinds of data are exchanged between the control devices. To be more specific, when test shells 1 are transferred from the aligner 2 to the reliability test apparatus 3, the bar code read device 36 reads the shell identification codes 14 of the contactors 12. Each test shell ID is identified on the basis of a read BCR value. As shown in FIG. 1B, the shell identification code (BCR value) of each test shell 1 is transmitted from the test chamber to the aligner 2 by way of the transmission system 41 (e.g., communication means). Upon reception of the BCR value of a test shell 1, the aligner 2 transmits an acknowledge signal to the reliability test apparatus 3. Along with the acknowledge signal, the aligner 2 transmits the wafer ID of the wafer W, the lot ID, and the slot ID, which correspond to the BCR value of the shell 1, to the reliability test apparatus 3. Those data will be hereinafter referred to simply as "wafer data." In return, the reliability test apparatus transmits an acknowledge signal to the aligner 2, indicating that the wafer data have been normally received. After completion of these procedures, the reliability of the wafer W is tested.

Figure 6:
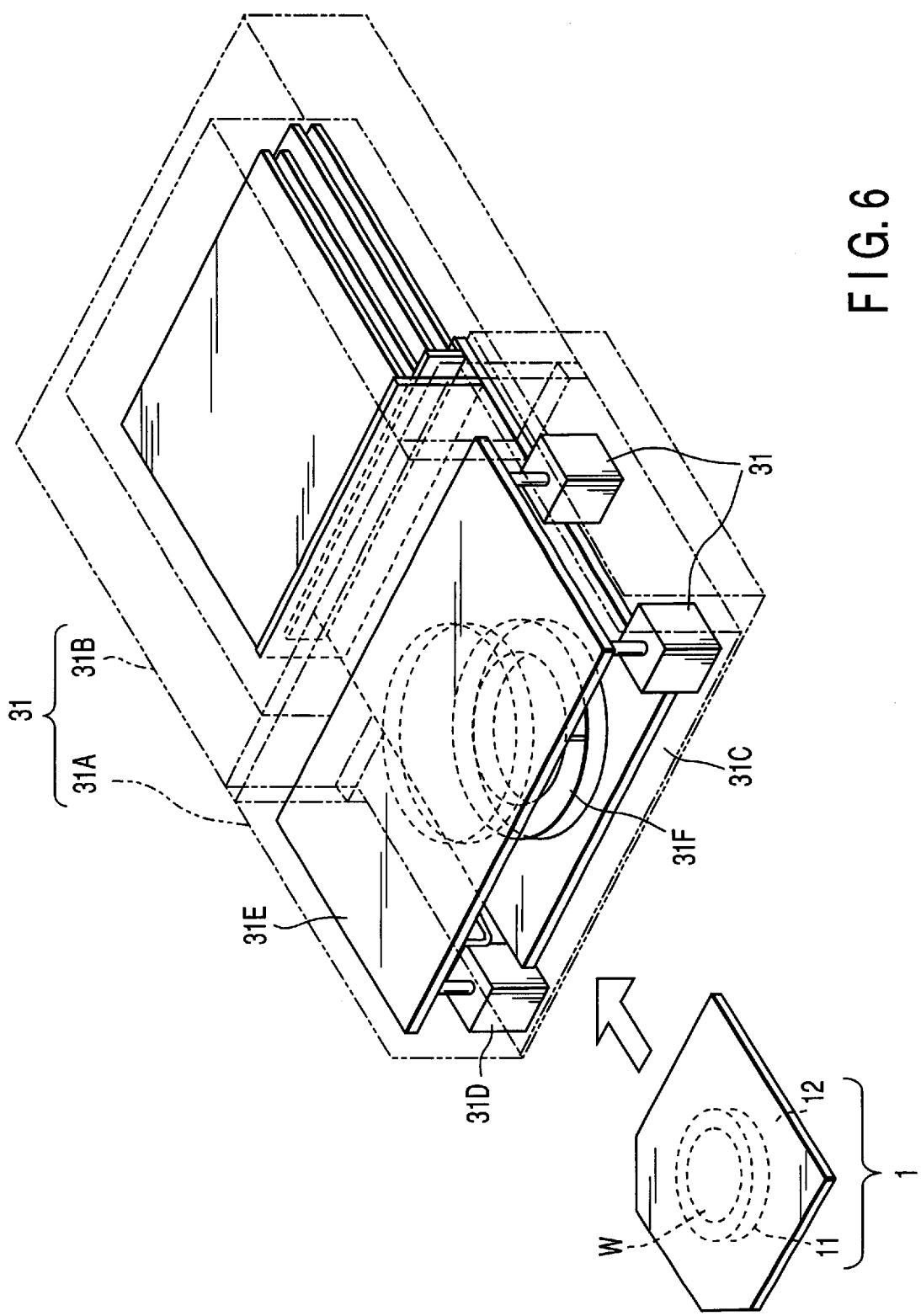
FIG. 6 is a perspective view showing the interior of the test chamber shown in FIG. 5.

As shown, for example, in FIG. 6, each testing test chamber 31 is provided with a temperature control chamber 31A and a connector chamber 31B adjacent thereto. As shown in the Figure, the base plate 31C of the temperature control chamber 31A has a cylinder mechanism 31D at each of the four corners. The upper end of the cylinder rod of each cylinder mechanism 31D is connected to the corresponding corner of a push plate 31E, which is located above the base plate 31C. A clamp mechanism (not shown) is provided on the reverse side of the push plate 31E. From this clamp mechanism, the test chamber 31 receives a test shell 1. A connector and a wiring board, which are used for connection to the tester 33, are arranged inside the connector chamber 31B. As shown in the Figure, the base plate 31C is provided with a bottom jacket (not shown). This bottom jacket is surrounded by a large number of pogo pins 31F (e.g., 2,000 to 3,000 pins), and these pins 31F are arranged to form a ring-like shape. The pogo pins 31F are arranged in correspondence to a large number of external terminals, which are also arranged to form a ring-like shape at positions around the bump terminals of the contactor 12. When a test is executed, the bump terminals are electrically connected to the external terminals, and through these terminals test signals are exchanged between the electrodes of the IC chips and the tester 33. The bottom jacket incorporates a temperature adjusting mechanism and sets a test shell 1 at predetermined temperature (e.g., 110° C.) in cooperation with a cooling jacket (not shown) secured to the push plate 31E. In this manner, the temperature of the test shell 1 is kept as an optimal temperature inside the temperature control chamber 31A.

Figure 7:
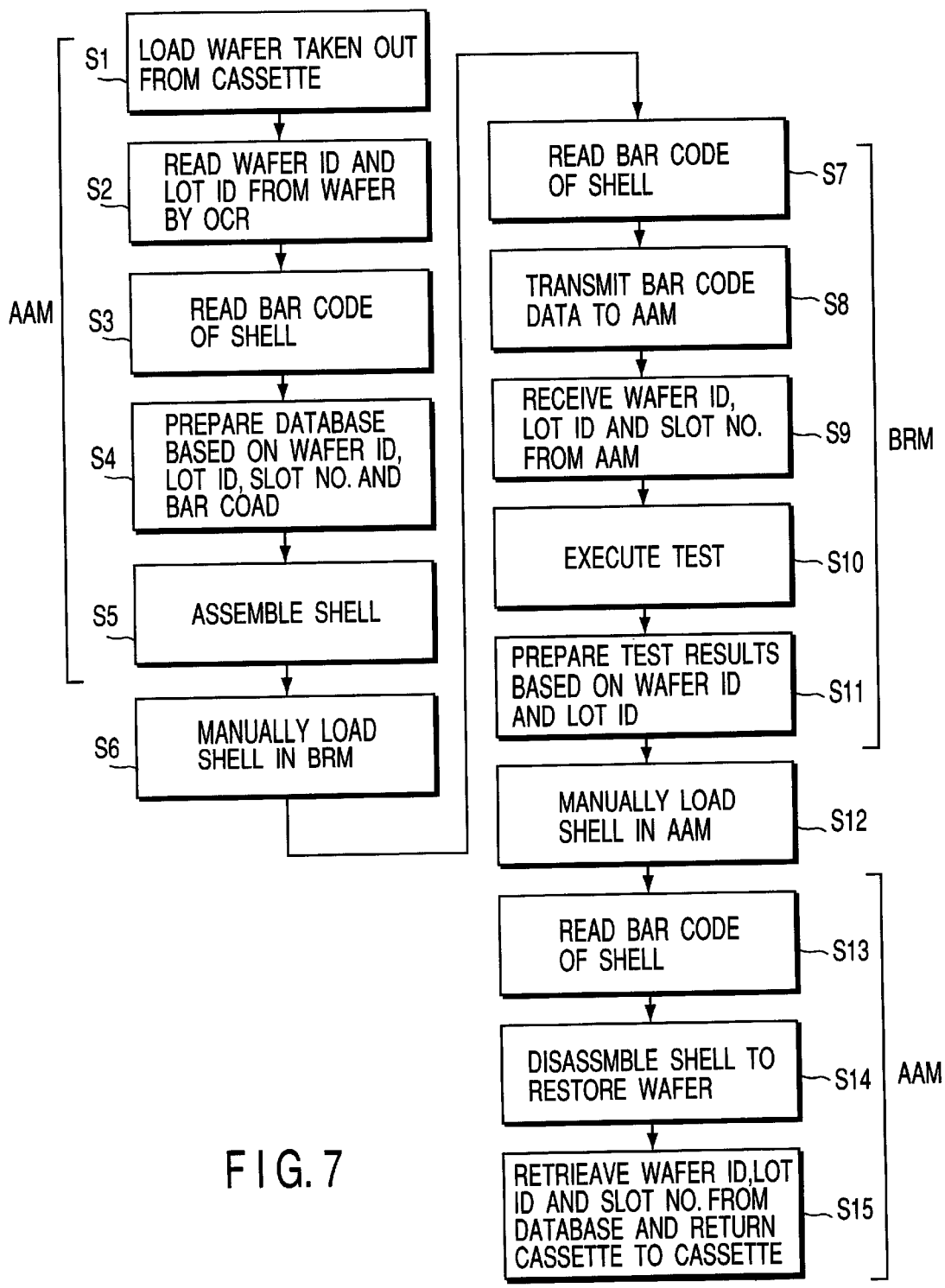
FIG. 7 is a flowchart showing how the test system of FIG. 1A operates.

An operation of the reliability test system will be described with reference to the flowchart shown in FIG. 7. In FIG. 7, "AAM" represents an aligner, and "BRM" represents a reliability test apparatus. First of all, the head plate 22A is opened by the opening/closing mechanism 22B. The contactor is placed on the head plate 22A, and the wafer chuck 11 is placed on the main chuck 26. At the time, the first and second valve mechanisms 11D and 11E of the wafer chuck 11 are aligned with the first and second quick couplings 27A and 27B, respectively. After the head plate 22A is closed by the opening/closing mechanism 22B, the vacuum evacuating apparatus (not shown) is driven to thereby attract the wafer chuck 11 to the main chuck 26 by vacuum suction. Then, the air cylinder 27D of the valve operation mechanism 27 is driven so as to connect the first and second quick couplings 27A and 27B to the first and second valve mechanisms 11D and 11E of the wafer chuck 11, respectively.

Wafers W are taken out one by one from a cassette in the loader chamber 21. Each wafer W is subjected to pre-alignment by the tweezers and sub chuck. Then, the wafer W is placed on the wafer chuck 11 by the tweezers (Step S1). In the meantime, the wafer identification code (character information) 13 is read by the OCR 23 (Step S2). After the bar code 14 of the contactor 12 is read by the bar code read device 24, a database wherein the wafer identification code 13 and the bar code 14 are associated based on the OCR and BCR values is prepared (Step S4). The database, thus obtained, is stored in a storage device. It should be noted that when the wafer W is placed on the wafer chuck 11, their centers (more specifically, the centers of the wafer chuck 11 and the main chuck 26) are not necessarily aligned with each other (they may be aligned, but they are not in most cases). This being so, the center position coordinates (e.g., X-Y coordinates) of the head plate 22A are stored in the storage device of the first control device 25.

Thereafter, the wafer W is secured to the wafer chuck 11 by vacuum suction by the vacuum evacuating apparatus (not shown). Subsequently, the X and Y stages 26B and 26C and the θ driving mechanism 26D are actuated. The alignment mechanism is driven to align the electrode pads of the wafer W with the bump terminals 12A of the contactor 12. In this manner, the centers of the wafer W and the head plate 22A are aligned with each other. As described above, however, the center of the wafer W is shifted slightly from that of the main chuck 26, the central processing unit of the first control device 25 calculates the positional shift between the center position coordinates (e.g., X-Y coordinates) of the head plate 22A on which the contactor is placed and the center position coordinates (e.g., X-Y coordinates) at which the main chuck 26 is located after alignment. The positional shift, thus calculated, is stored in the storage device. After the alignment is executed in this manner, the main chuck 26 is raised by the rotating/lifting mechanism 26A, and the electrode pads of the wafer w are simultaneously brought into contact with the bump electrodes 12A, as shown in FIG. 3. In this state, the wafer chuck 11, the wafer W and the contactor 12 are assembled as a one-body structure to form the test shell 1 (Step S5). Then, the valve operation mechanism 27A, 27B is disconnected from the valve mechanism 11D and 11E. As a result, the valve mechanisms 11D and 11E are set in the closed state, and the region between the wafer chuck 11 and the contactor 12 is kept in the vacuum state, thereby enabling the test shell 1 to be transferred. The X-Y position coordinates and/or θ position coordinates at which the main chuck 26 is located when the wafer chuck 11, the wafer W and the contactor 12 are assembled as the one-body structure, and the positional shift between the centers of the head plate 22A and the main chuck 26, are stored in the first control device 25 as a database wherein the contactor 12 and the wafer W are associated with each other.

The operator takes out the shell 1 from the aligner and loads it in the reliability rest apparatus 3 (Step S6). At the time, the shell identification code (bar code 14) of the test shell 1 is read by the read device 36 (the bar code read device) (Step S7). As shown in FIG. 1B, the BCR value is sent to the aligner 2 through the electrical transmission system (e.g., an electrical communication device) 41 (Step S8). Upon reception of the BCR value from the reliability test apparatus 3, the aligner 2 transmits an acknowledge signal that represents the normal reception of the BCR value. Simultaneously, the aligner 2 sends wafer data to the reliability test apparatus (Step S9). Upon reception of the wafer data from the aligner 2, the reliability test apparatus 3 sends an acknowledge signal, which indicates the normal reception of the data, to the aligner 2, thereby informing the aligner that preparations of the test have been made. As described above, each test shell 1 is located in the corresponding test chamber 31. Under the control of the second and third control devices 34 and 35, a reliability test is executed with respect to the wafer W in each test chamber 31, on the basis of the test signals sent from the tester 33 (Step S10). At the end of the test, test results about the chips of each wafer W are prepared (Step S11). The test results are stored in the second and third storage devices 34b and 3b of the second and third control devices.

The test shell 1 in each test chamber 31 is taken out and loaded in the aligner 2 by the operator (Step S12). The bar code 14 of the shell 1 is read by the bar code read device 24 (Step S13), and the shell is identified based on the read BCR value. After the shell 1 is mounted on the head plate 22A, the first control device 25 of the aligner 2 retrieves, from the database, the position coordinate data obtained when the shell is formed and the position shift data representing the positional shift between the wafer W and the main chuck 26. The main chuck 26 is first moved in accordance with the position data on the wafer W and then moved in the X and Y directions in such a manner as to adjust the positional shift with reference to the wafer W. In this manner, the main chuck 26 is moved to the position at which it is located when the shell is formed. Subsequently, the main chuck 26 is raised from that position, and the positioning pins of the main chuck 26 are fitted into the holes of the wafer chuck 12, whereby the main chuck 26 is connected to the shell 1. As a result, the first and second quick couplings 27A and 27B of the valve operation mechanism 27 are located on the extensions of the valve mechanisms 11D and 11E of the wafer chuck 11, and can therefore be smoothly connected to the valve operation mechanism 11D, 11E. The valve mechanisms 11D and 11E are set in the open state by the valve operation mechanism 27. As a result, the internal passage of the main chuck 26 is made to communicate to the atmosphere, thus allowing the shell 1 to be ready for disassembling.

When the shell 1 and the main chuck 26 are coupled together, the main chuck 26 is moved in such a manner that its center aligns with the center of the head plate 22A (i.e., the center of the wafer W). In this state, however, the wafer chuck 11 and the main chuck 26 cannot be coupled since the holes of the former and the positioning pins of the latter are not aligned. According to the embodiment, the position of the main chuck 26 is controlled on the basis of the bar code 14 of the contactor and in accordance with the positional shift between the wafer W and the main chuck 26. Owing to this control, the shell 1 and the main chuck 26 can be reliably coupled, and the shell can be reliably disassembled (Step S14). On the basis of the BCR value of the shell 1, the first control device 25 retrieves the wafer data (e.g., a wafer ID, a lot ID and a slot ID) regarding the corresponding wafer W, and drives the tweezers to return the wafer W to the cassette's original position corresponding to the slot ID (Step S15).

According to the embodiment, two read devices, namely the read device (OCR) 23 for reading the wafer identification code (character information) 13 attached on the wafer W and the read device (bar code read device) 24 for reading the bar code 14 attached to the shell 12, are provided for the aligner 2. Likewise, a read device (bar code read device) 36 for reading the shell identification code (bar code) 14 of the shell 1 is provided for the reliability test apparatus 3. In addition, the transmission system (electrical communication device) 41 is employed, which enables the aligner 2 and the reliability test apparatus 3 to exchange the information read by the OCR 23 and the bar code read devices 24 and 36. The first storage device, which stores data associating the wafer W and the contactor 12 with each other on the basis of the information from the OCR 23 and the barcode read devices 24 and 36, is provided for the first control device 25. Owing to this structure, a reliability test of a wafer W can be executed accurately and reliably on the basis of the character information 13 of the wafer w and the bar code 14 of the contactor 12.

According to the present embodiment, the data on the position where the wafer chuck 11, the wafer W and the contactor 12 are assembled together to form a shell 1 is stored in the first storage device 25b of the control device 25. When the shell 1 is disassembled in the aligner 2, the bar code 14 of the shell 1 is read by the bar code read device 24 of the aligner 2. What is required is simply a matter of placing the shell 1 on the main chuck 26. In response to this, the main chuck 26 is moved in the X, Y, Z and θ directions on the basis of the BCR value of the shell 1 under the control of the first control device 25. By this movement, the main chuck 26 is quickly returned to the position where it is located when the shell 1 is formed. Since the main chuck 26 and the shell 1 can be coupled reliably, the first and second quick couplings 27A and 27B of the valve operation mechanism 27 can be connected to the valve mechanisms 11D and 11E of the wafer chuck 11 quickly and rapidly. Accordingly, the shell 1 can be disassembled into the wafer chuck 11, the wafer W and the contactor 12 quickly and reliably.

Figure 8:
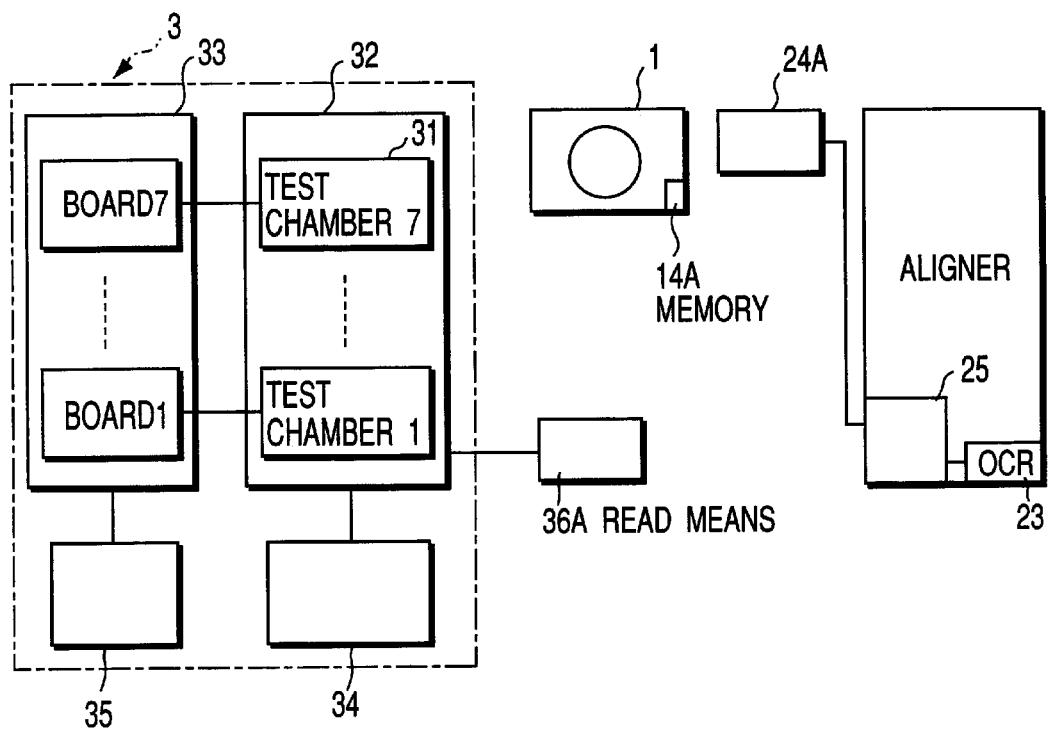
FIG. 8 shows a test system according to another embodiment of the present invention.
Figure 9:
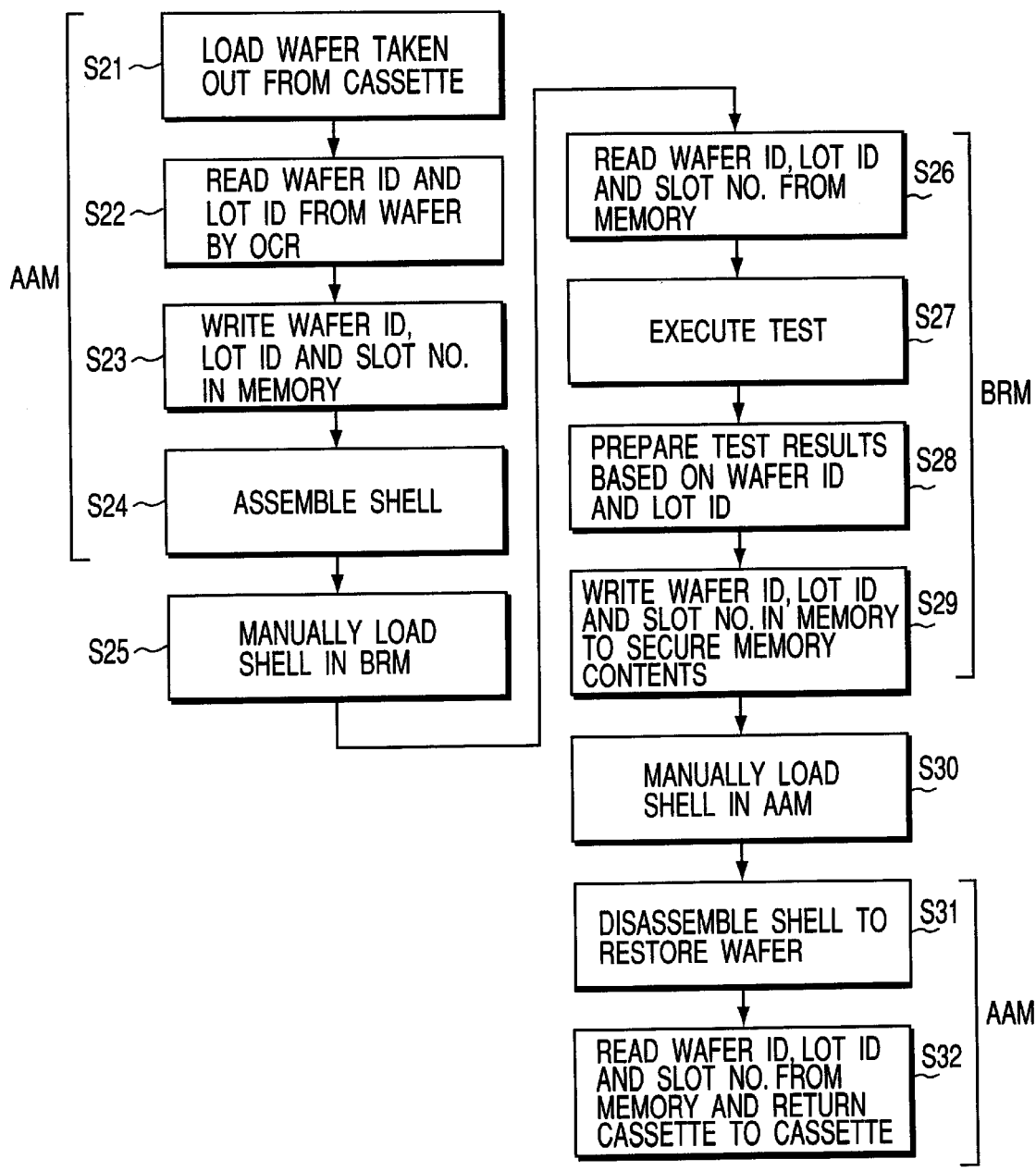
FIG. 9 is a flowchart showing how the test system of FIG. 8 operates.

FIGS. 8 and 9 show another embodiment of the present invention. The reliability test system in this embodiment will be described, using the same reference numerals or symbols to denote structural elements corresponding or similar to those of the foregoing embodiment. As shown in FIG. 8, in the second embodiment, the bar code 14 of the contactor 12 is not employed. Instead, a memory 14A made of a magnetic material is employed, for example. Necessary information are written in the memory 14A so that the memory 14A can serve as a transmission system for transmitting information between the aligner 2 and the reliability test apparatus 3. The aligner 2 employs a read/write means, such as a magnetic head 24A, in place of the bar code read device 24. The bar code read device 36 of the reliability test apparatus 3 is replaced with read/write means serving as a magnetic head 36A. Character information 13 read by the OCR 23 and test results obtained by the reliability test apparatus 3 are stored in the memory 14A. In the second embodiment, therefore, the memory 14A is employed as the transmission means 4, and the communication means 41 of the foregoing embodiment is not required. Except for these features, the second embodiment is similar to the foregoing embodiment.

An operation of the second embodiment will be described with reference to FIG. 9. Wafers W are taken out one by one from a cassette in the loader chamber 21. Each wafer W is subjected to pre-alignment by the tweezers and sub chuck. Then, the wafer W is placed on the wafer chuck 11 by the tweezers (Step S21). In the meantime, the character information 13 on the wafer W is read by the OCR 23 (Step S22). The read information is written in the memory 14A by the magnetic head 24A, thus saving wafer data (Step S23). Then, the valve operation mechanism 27 is driven by the first control device 25, so that the first and second quick couplings 27A and 27B are connected to the valve mechanisms 11D and 11E of the wafer chuck 11. After the wafer W is secured to the wafer chuck 11 by vacuum suction, the main chuck 26 is moved so as to align the electrode pads of the wafer W with the bump terminals 12A of the contactor 12. After this alignment, the main chuck 26 is raised, so that the electrode pads of the wafer W are simultaneously brought into contact with the bump electrodes 12A, as shown in FIG. 3. In this state, the wafer chuck 11, the wafer W and the contactor 12 are assembled into a one-body structure to form the test shell 1 by the vacuum evacuating apparatus (Step S24). The position coordinate data representing where the main chuck 26 is located then are written in the memory 14A by the magnetic head 24A. Then, the valve operation mechanism 27A, 27B is disconnected from the valve mechanism 11D and 11E. As a result, the wafer chuck 11 and the contactor 12 are assembled as the shell 1 that can be transported.

By the operator, each shell 1 is taken out from the aligner 2 and loaded into the reliability test apparatus 3 (Step S25). At the time, the magnetic head 36A reads wafer data from the memory 14A of the shell 1 (Step S26). The first and second control devices 34 and 35 execute a reliability test with respect to the wafer W in each test chamber 31 at a predetermined test temperature on the basis of test signals supplied from the tester 33 (Step S27). After this test, the second control device 35 prepares test results with respect to each of the IC chips formed on a wafer W (Step S28). By way of precaution, the wafer data stored in the storage device of the second control device 35 are written in the memory 14A of the shell 1 by the magnetic head 36A, thereby securing the wafer data (step S29). After the data in the memory 14A is secured in this manner, the operator takes the shell 1 out of each test chamber 31 and transport it to the aligner 2, where it is mounted on the head plate 22A (Step S30).

The magnetic head 24A reads the position coordinate data from the memory 14A, and the control device 25 adjusts the positional shift between the main chuck 26 and the wafer W. Thereafter, the main chuck 26 is moved to the position where it is located when the shell 1 is formed, and is coupled to the shell 1 at that position. Under the control of the control device 25, the valve operation mechanism 27 connects the first and second quick couplings 27A and 27B to the valve mechanisms 11D and 11E, respectively, and the valve mechanisms 11D and 11E are set in the open state. As a result, the internal passage of the main chuck 26 is made to communicate to the atmosphere, and the shell 1 is disassembled (Step S31). The magnetic head 24A reads wafer data from the memory 14A. On the basis of the wafer data (e.g., a wafer ID, a lot ID and a slot ID), the tweezers return the wafer W to the cassette's original position corresponding to the slot ID (Step S32).

According to the present embodiment, the OCR 23 for reading character information 13 attached on the wafer W is provided for the aligner 2, the memory 14A for storing the character information 13 is provided for the contactor 12, and the magnetic head 36A for reading the data stored in the memory 14A is provided for the reliability test apparatus 3. With this structure, advantages similar to those of the foregoing embodiment can be expected.

The above embodiments were described, referring to the case where the present invention is applied to a reliability test apparatus. Needless to say, however, the present invention is applicable to various types of apparatus that inspect (or test) the electric characteristics of the IC chips formed on a wafer.

In the above embodiments, the OCR 23 and the bar code read device 24, both serving as read means, are provided for the aligner 2. However, the bar code read device 24 may be replaced with an OCR.

According to the above embodiments, the operator manually transports shells. This transport operation and the loading operation may be performed automatically.

The first, second and third control devices of the present invention may be electronic circuits. Alternatively, they may be realized by software.

An electrical communication device is one type of transmission system that can be employed in the present invention. As this electrical communication device, either an electrical wire communication device or an electrical wireless communication device can be employed.

In the above embodiments, position coordinates are utilized to show test shell formation conditions. The conditions need not be represented by the position coordinates. For example, a wafer identification number, a wafer chuck model number, a contactor model number, a main chuck model number, the temperature condition under which a test shell is formed, an operator recognition number, and other various conditions can be utilized.

In the above embodiments, a variety of information are exchanged between the aligner and the test chambers. The information that are exchanged can be restricted properly. For example, the information can be restricted to information regarding shell identification codes and test results.

According to the present invention, it is possible to provide a reliability test system which, after a reliability test, automatically moves a main chuck to the same position as it is located when a wafer holder member, a wafer and a contactor are assembled as a one-body structure, thereby enabling the shell and the main chuck to be coupled smoothly and easily, and enabling the shell to be quickly disassembled into the wafer holder member, wafer and contactor.

According to the present invention, it is possible to provide a reliability test system which, at the time of the disassembly of a shell, automatically moves a main chuck to the same position as it is located when the shell is formed by assembling a wafer holder member, a wafer and a contactor as a one-body structure, thereby enabling the shell and the main chuck to be coupled smoothly and easily, which has eliminated the need to employ communication means between an aligner and a reliability rest apparatus, and which is simple in structure.

What is claimed is:

1. A test system for testing semiconductor elements formed on a semiconductor wafer, comprising:

an aligner for bringing three components into contact with one another to form a one-body structure, said three components being a wafer holder member used for holding a semiconductor wafer, a semiconductor wafer having a plurality of semiconductor elements on a surface, and a contactor having a plurality of contact terminals to be brought into electric contact with electrodes of the semiconductor elements, said one-body structure being used as a test shell, said aligner including:
a shell assembling mechanism for forming the test shell by vacuum suction;
a first read device for reading a shell identification code attached to the test shell;
a first storage device for storing the read shell identification code; and
a first control device for controlling the shell assembling mechanism to form the test shell;

a test apparatus for executing a test with respect to the semiconductor elements of the test shell, said test apparatus including:
a second read device for reading the shell identification code attached to the test shell; and
a second storage device for storing results of the test in association with the shell identification code; and a transmission system for enabling information stored in the first and second storage devices to be exchanged between the aligner and the test apparatus.

2. A test system according to claim 1, wherein:
said aligner further includes a third read device for reading a wafer identification code attached to the semiconductor wafer; and
said first storage device further stores the wafer storage code.

3. A test system according to claim 1, wherein said transmission system is an electrical communication device.

4. A test system according to claim 1, wherein said transmission system is a memory provided for the test shell.

5. A test system according to claim 1, wherein said test apparatus is a reliability test apparatus.

6. A test system according to claim 1, wherein said shell identification code is attached to at least one of the contactor and wafer holder member of the test shell.

7. A test system for testing semiconductor elements formed on a semiconductor wafer, comprising:
an aligner for bringing three components into contact with one another to form a one-body structure, the three components being a wafer holder member used for holding a semiconductor wafer, a semiconductor wafer having a plurality of semiconductor elements on a surface, and a contactor having a plurality of contact terminals to be brought into electric contact with electrodes of the semiconductor elements, said one-body structure being used as a test shell, said aligner including:
a shell assembling/disassembling mechanism for forming the test shell by vacuum suction and for disassembling the test shell by removing the vacuum suction;
a first read device for reading a shell identification code attached to the test shell;
a first storage device for storing conditions under which the test shell is formed by the shell assembling/disassembling mechanism and the shell identification code read by the read device; and
a first control device for controlling the shell assembling/disassembling mechanism to form or disassemble the test shell;

a test apparatus for executing a test with respect to the semiconductor elements of the test shell, said test apparatus including:
a second read device for reading the shell identification code attached to the test shell; and
a second storage device for storing results of the test in association with the shell identification code; and a transmission system for enabling information stored in the first and second storage devices to be exchanged between the aligner and the test apparatus.

8. A test system according to claim 7, wherein conditions under which the test shell is formed include position coordinates representing where the wafer holder member and the contactor are located when the test shell is formed.

9. A test system according to claim 7, wherein:
said aligner further includes a third read device for reading a wafer identification code attached to the semiconductor wafer; and
said first storage device further stores the wafer storage code.

10. A test system according to claim 7, wherein said transmission system is an electrical communication device.

11. A test system according to claim 7, wherein said transmission system is a memory provided for the test shell.

12. A test system according to claim 7, wherein said test apparatus is a reliability test apparatus.

13. A test system according to claim 7, wherein said shell identification code is attached to at least one of the contactor and wafer holder member of the test shell.

14. A test system for testing semiconductor elements formed on a semiconductor wafer, comprising:
an aligner for bringing three components into contact with one another to form a one-body structure, said three components being a wafer holder member used for holding a semiconductor wafer, a semiconductor wafer having a plurality of semiconductor elements on a surface, and a contactor having a plurality of contact terminals to be brought into electric contact with electrodes of the semiconductor elements, said one-body structure being used as a test shell, said aligner including:
an attaching mechanism for attaching the contactor to a predetermined position on a main body of the aligner;
a mount table on which the wafer holder member holding the semiconductor wafer thereon is placed;
a mount table-driving mechanism for moving the mount table in X, Y and θ directions to position the electrodes of the semiconductor elements with reference to the contact terminals of the contactor;
a first read device for reading a shell identification code attached to the test shell;
a first storage device for storing position coordinates representing a position to which the mount table is moved in the X, Y and θ directions for positioning;
a shell assembling/disassembling mechanism for forming the test shell by vacuum suction and for disassembling the test shell by removing the vacuum suction;
a first control device for setting the test shell at a disassembling position based on the position coordinates representing a position at which the mount table is located when the test shell is formed, and for performing control to disassemble the test shell;

a test apparatus for executing a test with respect to the semiconductor elements of the test shell, said test apparatus including:
a second read device for reading the shell identification code attached to the test shell; and a second storage device for storing results of the test in association with the shell identification code; and a transmission system for enabling information stored in the first and second storage devices to be exchanged between the aligner and the test apparatus.

15. A test system according to claim 14, wherein:

said aligner further includes a third read device for reading a wafer identification code attached to the semiconductor wafer; and said first storage device further stores the wafer storage code.

16. A test system according to claim 14, wherein said transmission system is an electrical communication device.

17. A test system according to claim 14, wherein said transmission system is a memory provided for the test shell.

18. A test system according to claim 14, wherein said test apparatus is a reliability test apparatus.

19. A test system according to claim 14, wherein said shell identification code is attached to at least one of the contactor and wafer holder member of the test shell.

20. A method for testing electrical characteristics of semiconductor elements formed on a semiconductor wafer, said method comprising the steps of:

(a) bringing three components into contact with one another in an aligner to form a one-body structure, said three components being a wafer holder member used for holding a semiconductor wafer, a semiconductor wafer having a plurality of semiconductor elements on a surface thereof, and a contactor having a plurality of contact terminals to be brought into electric contact with electrodes of the semiconductor elements, said one-body structure being used as a test shell;

(b) reading a shell identification code attached to the test shell and storing the shell identification code in a first storage device;

(c) causing a test apparatus to execute a test for testing the electrical characteristics of the semiconductor elements formed on the semiconductor wafer included in the test shell; and (d) exchanging the shell identification code attached to the test shell and results of the test between the aligner and the test apparatus.

21. A method for testing electrical characteristics of semiconductor elements formed on a semiconductor wafer, said method comprising the steps of:

(a) bringing three components into contact with one another in an aligner to form a one-body structure, said three components being a wafer holder member used for holding a semiconductor wafer, a semiconductor wafer having a plurality of semiconductor elements on a surface thereof, and a contactor having a plurality of contact terminals to be brought into electric contact with electrodes of the semiconductor elements, said one-body structure being used as a test shell;

(b) reading a shell identification code attached to the test shell;

(c) storing conditions under which the test shell is formed, along with the shell identification code;

(d) causing a test apparatus to execute a test for testing the electrical characteristics of the semiconductor elements formed on the semiconductor wafer included in the test shell;

(e) exchanging information to be exchanged between the aligner and the test apparatus, the information to be exchanged including information regarding the shell identification code attached to the test shell, the conditions under which the test shell is formed, and results of the test; and (f) causing the aligner to disassemble the test shell on the basis of information transmitted from the test apparatus.

* * * * *